United States Patent
Albrecht et al.

(10) Patent No.: US 10,379,138 B2
(45) Date of Patent: Aug. 13, 2019

(54) ADAPTER FOR RECEIVING AN INTEGRATED CIRCUIT

(71) Applicant: TDK-Micronas GmbH, Freiburg (DE)

(72) Inventors: Stefan Albrecht, Mauchenheim (DE); Christian Schladebach, Ehrenkirchen (DE); Dominik Zimmermann, Freiburg (DE)

(73) Assignee: TDK—Micronas GmbH, Freiburg (DE)

( * ) Notice: Subject to any disclaimer, the term of this patent is extended or adjusted under 35 U.S.C. 154(b) by 234 days.

(21) Appl. No.: 15/403,098

(22) Filed: Jan. 10, 2017

(65) Prior Publication Data

US 2017/0199223 A1  Jul. 13, 2017

(30) Foreign Application Priority Data

Jan. 11, 2016  (DE) .................. 10 2016 100 366

(51) Int. Cl.
  *G01R 1/04* (2006.01)
  *G01R 31/28* (2006.01)
  *G01R 33/07* (2006.01)
  *H01L 43/06* (2006.01)
  *H01L 43/04* (2006.01)

(52) U.S. Cl.
  CPC ....... *G01R 1/0433* (2013.01); *G01R 31/2851* (2013.01); *G01R 33/07* (2013.01); *H01L 43/04* (2013.01); *H01L 43/065* (2013.01)

(58) Field of Classification Search
  CPC .. G01R 1/0433; G01R 31/2851; G01R 33/07; H01L 43/04; H01L 43/065
  USPC ..................... 324/228, 200, 207.11
  See application file for complete search history.

(56) References Cited

U.S. PATENT DOCUMENTS

| | | | |
|---|---|---|---|
| 5,481,203 A * | 1/1996 | Appold ............... | G01R 1/0433 324/756.02 |
| 6,853,178 B2 | 2/2005 | Hayat-Dawoodi | |
| 2001/0012725 A1* | 8/2001 | Maeda ................. | G01R 1/0433 439/526 |
| 2002/0079913 A1* | 6/2002 | Weber .................. | G01R 1/0433 324/756.02 |
| 2003/0227285 A1 | 12/2003 | Marasch et al. | |
| 2004/0174141 A1 | 9/2004 | Luz et al. | |
| 2005/0074992 A1* | 4/2005 | Chu ..................... | G01R 1/0433 439/70 |
| 2007/0247135 A1 | 10/2007 | Koga | |
| 2010/0142897 A1* | 6/2010 | Loveless ............. | G01R 1/0433 385/88 |

(Continued)

FOREIGN PATENT DOCUMENTS

DE  102 48 679 Al  4/2004

OTHER PUBLICATIONS

MLX90251Programmable Linear Hall Effect Sensor—Datasheet—Melexis (2012).

*Primary Examiner* — Giovanni Astacio-Oquendo
(74) *Attorney, Agent, or Firm* — 24IP Law Group USA, PLLC; Timothy DeWitt

(57) ABSTRACT

An adapter for receiving at least one integrated circuit with a Hall sensor in a housing. The adapter has a cavity for receiving the at least one integrated circuit in the housing, at least one opening connected with the cavity, and a magnetic-field generating apparatus for generating a magnetic field in the cavity. The adapter is used in a system for detecting the strength of a magnetic field.

7 Claims, 3 Drawing Sheets

(56) References Cited

U.S. PATENT DOCUMENTS

2014/0308008 A1* 10/2014 Mougin ............... G02B 6/3893
  385/71

* cited by examiner

ADAPTER FOR RECEIVING AN INTEGRATED CIRCUIT

CROSS-REFERENCE TO RELATED REFERENCED APPLICATIONS

This application claims benefit of and priority to German Patent Application DE 10 2016 100 366, filed on 11 Jan. 2016. The entire disclosure of German Patent Application DE 10 2016 100 366 is hereby incorporated by reference.

BACKGROUND OF THE INVENTION

Field of the Invention

The invention relates to an adapter for receiving an integrated circuit with a Hall sensor. The adapter is used in a system for detecting an electric current.

Brief Description of the Related Art

Sensors for detecting an electric current are already known. For example, the U.S. Pat. No. 6,853,178 B2 (Texas Instruments) discloses a metallic lead frame (connector frame) for use with a semiconductor chip for detecting a magnetic field. The magnetic field is caused by a current in a conductor and the current in the conductor can be computed by a measurement of the field strength of the generated magnetic field. The semiconductor chip of the above US Patent contains an integrated circuit with a Hall sensor which detects the value of the field strength and forwards it to a computing unit for computing the current.

The sensors on a lead frame known so far have different dimensioning and are configured for different current values. The sensors consequently have to be selected separately for each application. The integrated circuit with the Hall sensor, however, is substantially identical and the differences are merely given due to the different dimensioning of the sensor.

There is consequently a demand for developing a sensor that takes on different current ranges/dimensioning and can thus be used cost-effectively.

SUMMARY OF THE INVENTION

This object is achieved according to the invention with an adapter for receiving at least one integrated circuit with a Hall sensor in a housing. The adapter has a cavity for receiving the at least one integrated circuit in the housing and has at least one opening that is connected with the cavity. A magnetic-field generating apparatus, for example a coil, generates a magnetic field in the cavity. The integrated circuit with the Hall sensor can thus be produced in one uniform size and the adapter takes on the form and the dimensions required for the respective application.

In one aspect the cavity has a guide holding the housing stable in the cavity, and the adapter has a fastening for retaining the housing in the cavity.

The coil generates a substantially homogeneous magnetic field in the cavity, thus enabling a measurement of the magnetic field strength by the Hall sensor proportional to the flowing current.

The adapter and the integrated circuit with the sensor are applied in a system for detecting the strength of a magnetic field and thus for detecting an electric current through a conductor.

BRIEF DESCRIPTION OF THE DRAWINGS

The invention will now be described on the basis of figures. It will be understood that the embodiments and aspects of the invention described in the figures are only examples and do not limit the protective scope of the claims in any way. The invention is defined by the claims and their equivalents. It will be understood that features of one aspect or embodiment of the invention can be combined with a feature of a different aspect or aspects of other embodiments of the invention. This invention becomes more obvious when reading the following detailed descriptions of some examples as part of the disclosure under consideration of the enclosed drawings. Referring now to the attached drawings which form a part of this disclosure. The invention will hereinafter be described in more detail with reference to figures, wherein there are shown:

DETAILED DESCRIPTION

Figure 1:
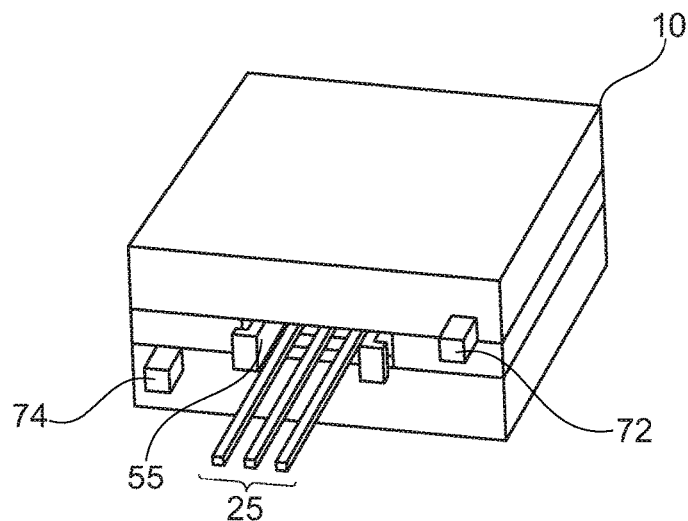
FIG. 1 a housing for a Hall sensor for receiving an adapter.
Figures 2, 3:
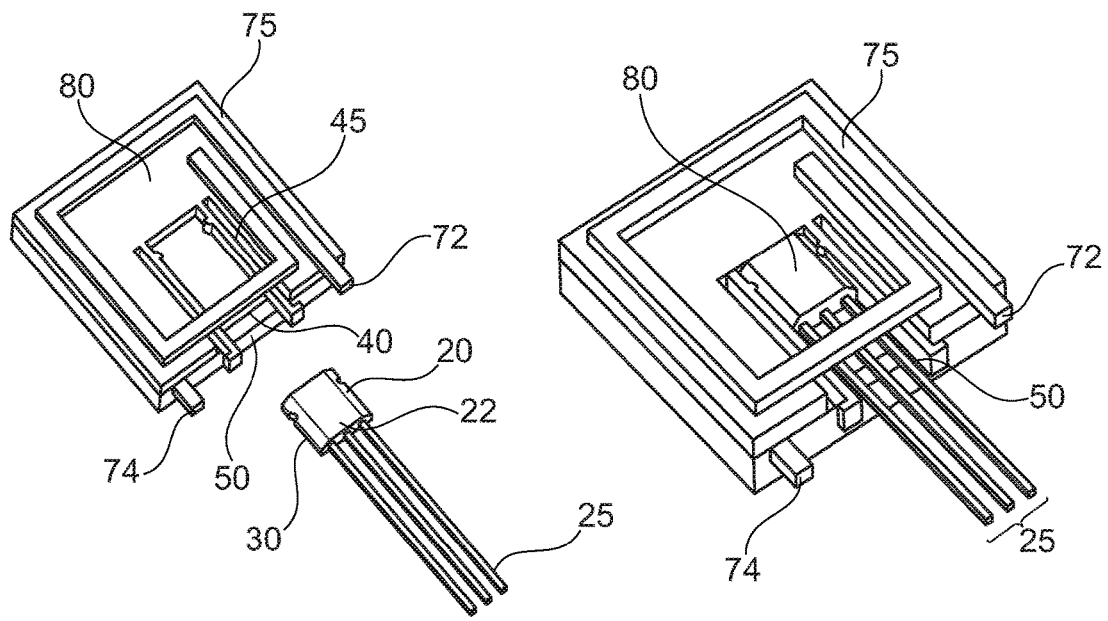
FIG. 2 an exemplary adapter with an integrated circuit before insertion in a cavity.
FIG. 3 the exemplary adapter with the inserted integrated circuit.

FIGS. 1 to 3 show an adapter 10 for receiving at least one integrated circuit 20. The circuit 20 has a magnetic field sensor 22, for example a Hall sensor, and is accommodated in a housing 30 with external connector lines 25. The external connector lines 25 are connected in the housing 30 with the Hall sensor 22 and other, not represented components and forward measuring values to a computing unit 110. The computing unit 110 contains control- and evaluation software.

As can be seen from the FIGS. 2 and 3, the adapter 10 has a cavity 40 for receiving the housing 30 with the integrated circuit 20. FIG. 2 shows the housing 30 before insertion through an opening 50 in one of the side walls of the adapter 10 and FIG. 3 shows the adapter 10 after insertion of the housing 30 into the cavity 40.

Figure 4:
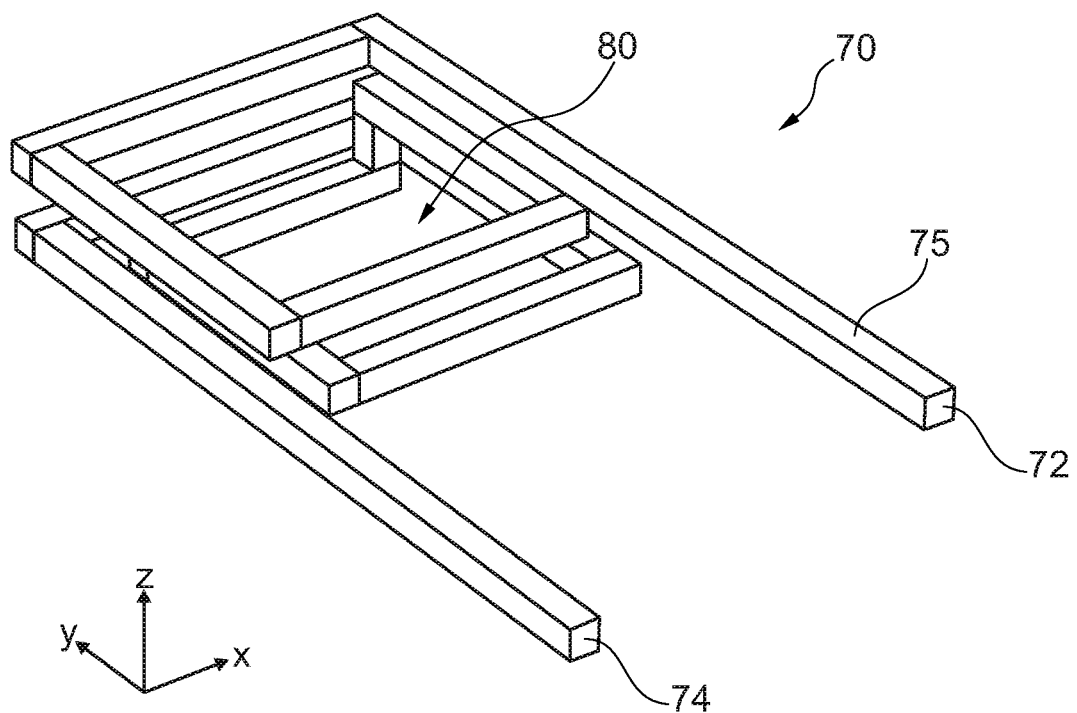
FIG. 4 the windings of the coil.

The adapter 10 has a current-conducting coil 70, which is arranged in a spiral shape in the adapter 10 and generates a magnetic field 80 in the center of the adapter 10, when current flows in the coil 70. The coil 70 is shown in more detail in FIG. 4. In the example represented in FIG. 4, the coil 70 has two complete windings 75, as well as connectors 72 and 74. The windings 75 and the connectors 72 and 74 are produced of copper, aluminum or an alloy, for example. The number of windings 75 is not limiting with regard to the present invention. Simulations show that the magnetic field 80 within the coil 70 and thus also in the cavity 40 is substantially homogeneous. Consequently, the Hall sensor 22 in the cavity 40 can detect and compute an exact value of the magnetic field 80 and thus the current flowing through the coil 70. The connectors 74 and 75 are connected with an external circuit, an on-board network of a car, for example.

The adapter 10 receiving the coil 70 and the Hall sensor 22 can be produced by an injection-molding method.

The cavity 40 has at least one guide 45 guiding the housing 30 with the integrated circuit 20 into the cavity 40 and holding it stable. In FIG. 2 two guides 45 are represented exemplarily as guide rails interacting with corresponding counterparts on the outside of the housing 30 in order to guide and retain the housing 30 in the cavity 40. At least one fastening 55 is applied to the adapter 10 next to the opening 50 and holds the housing 30 into the cavity 40. In FIGS. 1 and 2 two fastenings 55 are represented exemplarily, which are configured as clips. These fastenings 55 enable the locking of the housing 30 in the cavity 40 of the adapter 10.

In a further configuration of the adapter 10, the cavity 40 can receive two integrated circuits 20, which are arranged either above each other or next to each other. The adapter 10 can also have a shielding, which substantially prevents an undesirable influencing of the Hall sensor 22 by stray fields.

Figure 5:
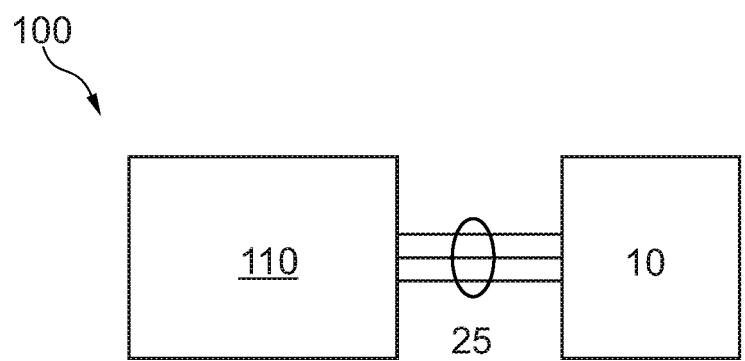
FIG. 5 the system.

FIG. 5 shows a system 100 for measuring a current by means of the Hall sensor 22 in the adapter 10. The integrated circuit 20 detects the strength of the generated magnetic field 80 in the coil 70 and forwards these values to a computing unit 110 via the connector lines 25. The computing unit 110 can recognize thereby whether a current flows in the coil 70 and can compute the value of the flowing current with the corresponding data of the field strength.

The adapter 10 can be produced with different dimensions depending on the application. For example, the adapter has a height of 3.0-6.5 mm and an area of 10×10 mm to 15×15 mm with 2 windings.

Figure 6A:
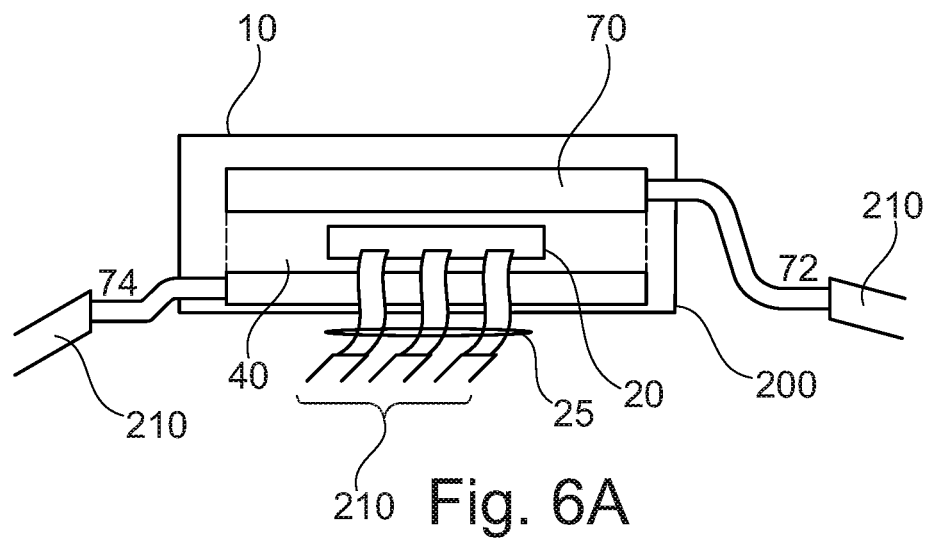
FIG. 6A and FIG. 6B the adapter on the surface of a circuit board.
Figure 6B:
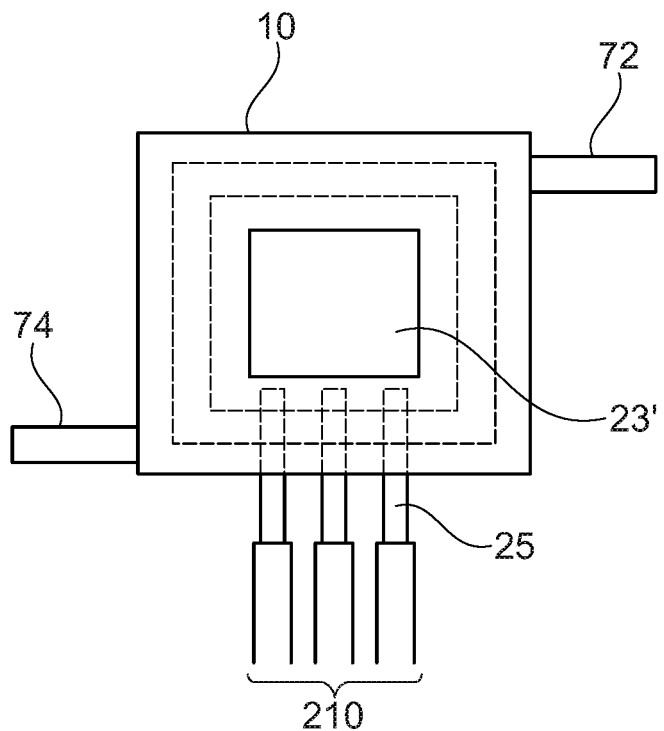

FIG. 6A shows a side view of the adapter 10, and FIG. 6B shows a plan view of the adapter 10 on a surface of a circuit board 200 with conductor paths 210 on the surface. The connectors 72 and 74 and the connector lines 25 are connected with the conductor paths 210 via wires and can be soldered or clamped thereto. The adapter 10 thus can be placed and connected fully automatically on the circuit board 200 and can consequently be used in a surface-mounting production line (so-called SMD components).

The adapter 10 can be used, for example, in a fuse box for the on-board network of a car in order to check the flowing of the current through the on-board network, its function making a contribution to fuse protection. These fuse-protection concepts lead to economies in the on-board network architecture through saving weight and for a better use to capacity of the installed and dimensioned wire cross sections. Further applications are the detection of current connectors in installations and machines.

From the above description of the present invention, those skilled in the art will perceive improvements, changes, and modifications on the present invention. Such improvements, changes, and modifications within the skill in the art are intended to be covered by the appended claims.

REFERENCE NUMBERS

10 adapter
20 integrated circuit
22 magnetic field sensor
25 connector lines
30 housing
40 cavity
45 guide
50 opening
55 fastening
70 coil
72 connector
74 connector
75 windings
80 magnetic field
100 system
110 computing unit
200 circuit board
210 conductor paths

What is claimed is:

1. An adapter for receiving at least one integrated circuit with a Hall sensor in a housing, wherein the adapter has:
   a cavity for receiving the at least one integrated circuit in the housing and having a guide for holding the housing stable within the cavity and for interacting with corresponding counterparts on the outside of the housing;
   at least one opening connected with the cavity;
   a fastening for retaining the housing with the cavity; and
   a magnetic-field generating apparatus for generating a magnetic field in the cavity.

2. The adapter according to claim 1, wherein the magnetic-field generating apparatus is a coil which generates a homogeneous magnetic field in the cavity.

3. The adapter according to claim 2, wherein the coil has at least two windings and the cavity is arranged between the windings.

4. The adapter according to claim 2, wherein the integrated circuit measures the strength of the magnetic field.

5. The adapter according to claim 2, wherein the integrated circuit measures changes in the magnetic field.

6. A system for detecting the strength of a magnetic field in an adapter for receiving at least one integrated circuit with a Hall sensor in a housing, wherein the adapter has:
   a cavity for receiving the at least one integrated circuit in the housing and having a guide for holding the housing stable within the cavity and for interacting with corresponding counterparts on the outside of the housing;
   at least one opening connected with the cavity;
   a fastening for retaining the housing with the cavity; and
   a magnetic-field generating apparatus for generating a magnetic field in the cavity.

7. A circuit board with an adapter for receiving at least one integrated circuit with a Hall sensor in a housing, wherein the adapter has:
   a cavity for receiving the at least one integrated circuit in the housing and having a guide for holding the housing stable within the cavity and for interacting with corresponding counterparts on the outside of the housing;
   at least one opening connected with the cavity;
   a fastening for retaining the housing with the cavity; and
   a magnetic-field generating apparatus for generating a magnetic field in the cavity.

* * * * *